United States Patent
Kussyk (10) Patent No.: US 9,720,019 B2
(45) Date of Patent: Aug. 1, 2017

(54) LOW-VOLTAGE DISTRIBUTION SYSTEM AND METHOD FOR OPERATING THE SAME

(75) Inventor: Jaroslaw Kussyk, Vienna (AT)

(73) Assignee: Siemens Aktiengesellschaft, Munich (DE)

(*) Notice: Subject to any disclaimer, the term of this patent is extended or adjusted under 35 U.S.C. 154(b) by 722 days.

(21) Appl. No.: 14/110,979

(22) PCT Filed: Apr. 15, 2011

(86) PCT No.: PCT/EP2011/056020
§ 371 (c)(1),
(2), (4) Date: Oct. 10, 2013

(87) PCT Pub. No.: WO2012/139658
PCT Pub. Date: Oct. 18, 2012

(65) Prior Publication Data
US 2014/0032144 A1    Jan. 30, 2014

(51) Int. Cl.
*G01R 19/00* (2006.01)
*H02J 13/00* (2006.01)

(52) U.S. Cl.
CPC .......... *G01R 19/00* (2013.01); *H02J 13/0006* (2013.01)

(58) Field of Classification Search
USPC ........................................................ 702/64
See application file for complete search history.

(56) References Cited

U.S. PATENT DOCUMENTS

| | | |
|---|---|---|
| 5,742,795 A | 4/1998 | Küssel |
| 7,272,518 B2 | 9/2007 | Bickel et al. |
| 8,207,726 B2 | 6/2012 | Vaswani et al. |
| (Continued) | | |

FOREIGN PATENT DOCUMENTS

| | | |
|---|---|---|
| CN | 1698246 A | 11/2005 |
| CN | 101258513 A | 9/2008 |
| (Continued) | | |

OTHER PUBLICATIONS

Maryam Sadeghi in Modern Methodology Introducing for Three Layers Intelligent Universal Transformers in Advanced Distribution Automation Equipping Pi Voltage and Current Source Controllers, JIEE.2013.V3.312, pp. 258-261.*

(Continued)

*Primary Examiner* — Tung Lau
(74) *Attorney, Agent, or Firm* — Laurence Greenberg; Werner Stemer; Ralph Locher (57) ABSTRACT

A method for determining a topology information item on a low-voltage electrical distribution system. A group of at least two current measuring devices that are arranged at different points in the low-voltage distribution system is selected, and in each case the current is measured by the current measuring devices so as to form a current measurement value. The current measurement values are added so as to form a current sum taking into consideration the current flow direction. A topology information item is formed which specifies that the current measuring devices electrically isolate a load-free and source-free section of the low-voltage distribution system when the current sum, in terms of absolute value, falls below a predetermined threshold value.

6 Claims, 3 Drawing Sheets

(56) References Cited

U.S. PATENT DOCUMENTS

| | | |
|---|---|---|
| 8,401,985 B2 | 3/2013 | Bickel et al. |
| 2004/0130837 A1 | 7/2004 | Papallo et al. |
| 2007/0005277 A1 | 1/2007 | Bickel et al. |
| 2007/0242402 A1 | 10/2007 | Papallo et al. |
| 2009/0112375 A1 | 4/2009 | Popescu |
| 2009/0300034 A1 | 12/2009 | Hasan et al. |

FOREIGN PATENT DOCUMENTS

| | | |
|---|---|---|
| CN | 101425672 A | 5/2009 |
| EP | 2246955 A2 | 11/2010 |
| RU | 2171494 C2 | 7/2001 |
| WO | 2009061291 A1 | 5/2009 |
| WO | 2010027421 A2 | 3/2010 |

OTHER PUBLICATIONS

A Highly-Efficient, Redundant Low-Voltage Solar Topology, 2015 12 pages.*

JoséRodríguez, Multilevel Inverters: A Survey of Topologies, Controls, and Applications, IEEE Transactions on Industrial Electronics, Vol. 49, No. 4, Aug. 2002, pp. 724-738.*

Reza Arghandeh in Micro-Synchrophasors for Power Distribution Monitoring, a Technology Review, printed Jul. 28, 2016, pp. 1-18.*

Jess Brown, Point of Load Converters—The Topologies, Converters, and Switching Devices Required for Efficient Conversion, Presented at PCIM Conference, May 14-16, 2002, Nuremburg, Germany, 6 pages.*

Bob villa, house voltage out of spec. 6 pages , printed on Feb. 8, 2017.*

DSL reports, 10 pages, printed on Feb. 8, 2017.*

Jukka Paatero, Second International Symposium on Distributed Generation: Power System and Market Aspects Stockholm, Oct. 2002, 14 pages.*

Du Xiong et al, "Three-phase Rectifier DC Side Parallel Active Power Filter", Proceedings of the CSEE, vol. 28, No. 15, p. 98-102, 2008, May 25, 2008—English abstract.

* cited by examiner

FIG 1

FIG 3

LOW-VOLTAGE DISTRIBUTION SYSTEM AND METHOD FOR OPERATING THE SAME

BACKGROUND OF THE INVENTION

Field of the Invention

With the increasing decentralization of the generation of electrical energy, for example by means of photovoltaic systems or small combined heat and power plants in private households, the nature of the use of distribution systems is changing from centralized electricity distribution (from one or more transformer stations in the direction of the energy user) to at least temporarily decentralized electricity distribution (for example from one household to another household or even from a plurality of private electricity generators in the direction of a transformer station or in the direction of a medium-voltage system).

To ensure monitoring of power distribution and the voltage quality and efficient control of the energy distribution systems, it is necessary to have the most accurate knowledge possible about the operating status of the distribution systems, the topology and the current load on the individual distribution systems.

The planning or expansion of low-voltage distribution systems often took place many years or even decades ago. In the subsequent period, a further evolutionary development of the distribution systems took place and changed the topology of the distribution systems in the form of additions, modifications and expansions. Documentation on the topology of low-voltage distribution systems was frequently not fully updated. It is also necessary to take into account the fact that low-voltage distribution systems contain a plurality of switching devices (switchable isolating points), which can, for example, be used to change systems during service work. It is frequently the case that the switching status of these switching devices is not known.

The result of the described practice for the operation of low-voltage distribution systems is that topology knowledge is patchy and in particular the switching status of isolating points is often unknown. This may be complicated by the fact that, in a public power supply system, at least temporarily unregistered system connections can take place, which could disrupt the monitoring of the system topology due to electricity being fed into or withdrawn from the system.

In order to overcome the problems described, in practice, the topology of low-voltage distribution systems is nowadays determined manually and entered into a so-called geographic information system (GIS). However, a geographic information system of this kind needs to be constantly maintained in order to keep the database up-to-date.

BRIEF SUMMARY OF THE INVENTION

The invention is based on the object of disclosing a method that is improved compared to the prior art for determining topology information items on a low-voltage electrical distribution system.

According to the invention, this object is achieved by a method with the features as claimed. Advantageous embodiments of the method according to the invention are disclosed in subclaims.

According to the invention, a method is envisaged in which
(a) a group of at least two current-measuring devices arranged at different points in the low-voltage distribution system is selected,
(b) in each case the current is measured by the current-measuring devices so as to form a current measurement value,
(c) the current measurement values are added taking into consideration the current flow direction so as to form a current sum and
(d) a topology information item is formed, which specifies that the current-measuring devices electrically isolate a load-free and source-free section of the low-voltage distribution system when the current sum, in terms of absolute value, falls below a predetermined threshold value.

A substantial advantage of the method according to the invention consists in the fact that it can be performed automatically, for example computer-aided. If a plurality of current-measuring devices are provided and accordingly there is a plurality of current measurement values, an automated evaluation of the current measurement values for the current devices can be used to determine which subgroups of the current-measuring devices electrically isolate a load-free and source-free section of the low-voltage distribution system and even without prior knowledge of the internal structure and the internal circuitry of the low-voltage distribution system. The topology information items can, therefore, subsequently be formed solely with reference to the available current measurement values. In other words, it is possible to determine the topology without any prior knowledge. The topology information items can advantageously subsequently be used for the further control of the low-voltage distribution system. For example, a topological image of the low-voltage distribution system can be created in a control center and used for the further control of the low-voltage distribution system. In this way, the topology information items make it possible, for example, to detect a subsequent change to the topology: namely, if the current sum of a previously source-free and load-free section of the low-voltage distribution system later exceeds the predetermined threshold value in terms of absolute value, it is established that there has been a change to the topology and it is necessary to update the topology information items. A change to the topology can, for example, be caused by a current being fed into a previously load-free and source-free section or a current being withdrawn from a previously load-free and source-free section; a topology change of this kind can, for example, take place in that—for whatever reason—an open isolating switch within the previously source-free and load-free section is closed and hence an additional current flow is enabled.

In order to understand the topology of the low-voltage distribution system as completely as possible in a simple way, it can, for example, be provided that
(e) in the event that in step (d) no topology information item has been formed, a new group of at least two current-measuring devices arranged at different points in the low-voltage distribution system is selected,
(f) in each case the current is measured by the current-measuring devices of the new group so as to form a new current measurement value,
(g) the new current measurement values are added so as to form a new current sum taking into consideration the current flow direction, (h) a topology information item is formed, which specifies that the current-measuring devices electrically isolate a load-free and source-free section of the low-voltage distribution system, when the new current sum, in terms of absolute value, falls below the predetermined threshold value, and (i) steps (e) to (h) are repeated until a topology information item has been formed.

The way described enables a plurality of current measuring device groups to be formed in order to obtain further topology information items step by step. For example, it is possible systematically—for example in accordance with a predetermined algorithm—to form current measuring device groups on the basis of all possible combinations of the current-measuring devices present in the low-voltage distribution system and evaluate them with respect to whether the threshold value is exceeded or fallen below. The corresponding topology information items generated can—as described above—be further processed centrally.

It is provided according to a particularly preferred embodiment of the method that, before the selection of the new group, a further current-measuring device is connected to the low-voltage electrical distribution system, wherein the further current-measuring device measures the current through an assigned point of the low-voltage distribution system, for example through a switching device of the low-voltage distribution system, and this further current-measuring device is added to the new group of current-measuring devices. With this embodiment of the method, for the automated acquisition of the topology information items, advantageously a "supplemented" low-voltage distribution system is formed, with which additional current-measuring devices for acquiring the operating status of the low-voltage distribution system can be used at points important for monitoring the topological properties of the low-voltage distribution system—such as, for example, power line branches, power line bifurcations, power line nodes or power line isolating points.

If, for example, current-measuring devices are inserted before or behind switching devices (switchable isolating points), it is possible simultaneously to acquire the switch position and further process this as a topology information item.

Preferably, time-averaged current measurement values of the fundamental component of the current flowing through the respective current-measuring devices are formed as current measurement values.

When operating current is withdrawn from the low-voltage distribution system for the operation of the current-measuring devices, the current consumption of the current-measuring devices can be taken into account in different ways: on the one hand, it is possible to set the predetermined threshold value for the formation of the topology information items such that the current consumption of the current-measuring devices is negligible in comparison; alternatively, it is possible also to take into consideration the current branch formed by the current-measuring devices when forming load-free and source-free sections and to take into consideration the current consumption of the current-measuring devices due to a corresponding discharge of current from the respective section.

The time-averaged current measurement values used can, for example, be time-averaged root-mean-square values, time-averaged amplitude values or time-averaged peak values of the fundamental component of the current.

The time-averaged current measurement values preferably indicate in each case the time-averaged active current and/or reactive current of the fundamental component of the current flowing through the respective current-measuring device for a predetermined period.

The invention also relates to a low-voltage distribution system, which enables automated acquisition of the topology by means of a central device.

In this respect, according to the invention a low-voltage distribution system is provided having at least one switching device, at least one current- and/or voltage-measuring device and a central device connected to the at least one current- and/or voltage-measuring device, wherein the at least one current- and/or voltage-measuring device is suitable for measuring the current flowing through the at least one switching device and/or the voltage applied to the at least one switching device with the formation of at least one current- and/or voltage-measurement value and for transmitting the at least one current- and/or voltage-measurement value or a status signal indicating the switching status of the at least one switching device to the central device.

With respect to the advantages of the low-voltage distribution system according to the invention, reference is made to the above statements in connection with the method according to the invention since the advantages of the low-voltage distribution system according to the invention substantially correspond to those of the method according to the invention. The current- and/or voltage-measuring devices can be used to acquire the switch settings of the switching devices and obtain corresponding topology information items, which may be used for the further control of the distribution system.

It is also possible in the case of voltage measurement for the voltage quality to be monitored during the evaluation of the voltage-measurement values.

The central device can be a separate component, which is connected to the switching devices. It is however considered to be particularly preferable for the central device to form a component of one of the current- and/or voltage-measuring devices.

Preferably, the current-measuring devices are embodied such that they form a time-averaged current measurement value of the fundamental component of the current as a current measurement value.

According to a particularly preferred embodiment of the low-voltage distribution system, it is provided that the at least one current-measuring device is embodied such that it determines at least two time-averaged current measurement values and transmits them to the central device, of which a first current measurement value indicates the averaged active current of the fundamental component of the current for a predetermined period and of which a second current measurement value indicates the averaged reactive current of the fundamental component of the current for the same predetermined period. An evaluation of the active current and reactive current enables the topology of the low-voltage distribution system to be determined particularly reliably.

It is also seen as advantageous for the low-voltage distribution system to comprise a group of at least two current-measuring devices, which, in each case, are assigned to a point of the low-voltage distribution system and are suitable for measuring the current so as to form at least one current measurement value and for transmitting the current measurement value to the central device, wherein the current-measuring devices in the group isolate a load-free and source-free section of the low-voltage distribution system. An arrangement of the current-measuring devices of this kind makes it possible in a very advantageous way to use the measuring results of the current-measuring devices to indicate the respective operating status of the low-voltage distribution system correctly.

The current-measuring devices in a respective group preferably form their current measurement values synchronously in order to reduce evaluation errors. A synchronous measurement can for example be achieved by external trigger signals; alternatively, the current-measuring devices can also perform their measurements autonomously at predetermined times.

In the event of time-averaging of the current measurement values, it is considered to be advantageous for the current-measuring devices in a particular group to determine the time-average of their current measurement values for the same predetermined period in each case.

With respect to synchronization errors, it is considered to be advantageous for the predetermined period over which time-averaging is performed to be greater than ten times the expected temporal synchronization error of the current-measuring devices in the respective group.

The central device of the low-voltage distribution system is preferably suitable for carrying out the method according to the invention for forming topology information items described in the introduction.

The invention is described below in more detail with reference to exemplary embodiments, wherein the following are shown by way of example:

DESCRIPTION OF THE INVENTION

For purposes of clarity, the same reference characters are always used for identical or comparable components in the figures.

Figure 1:
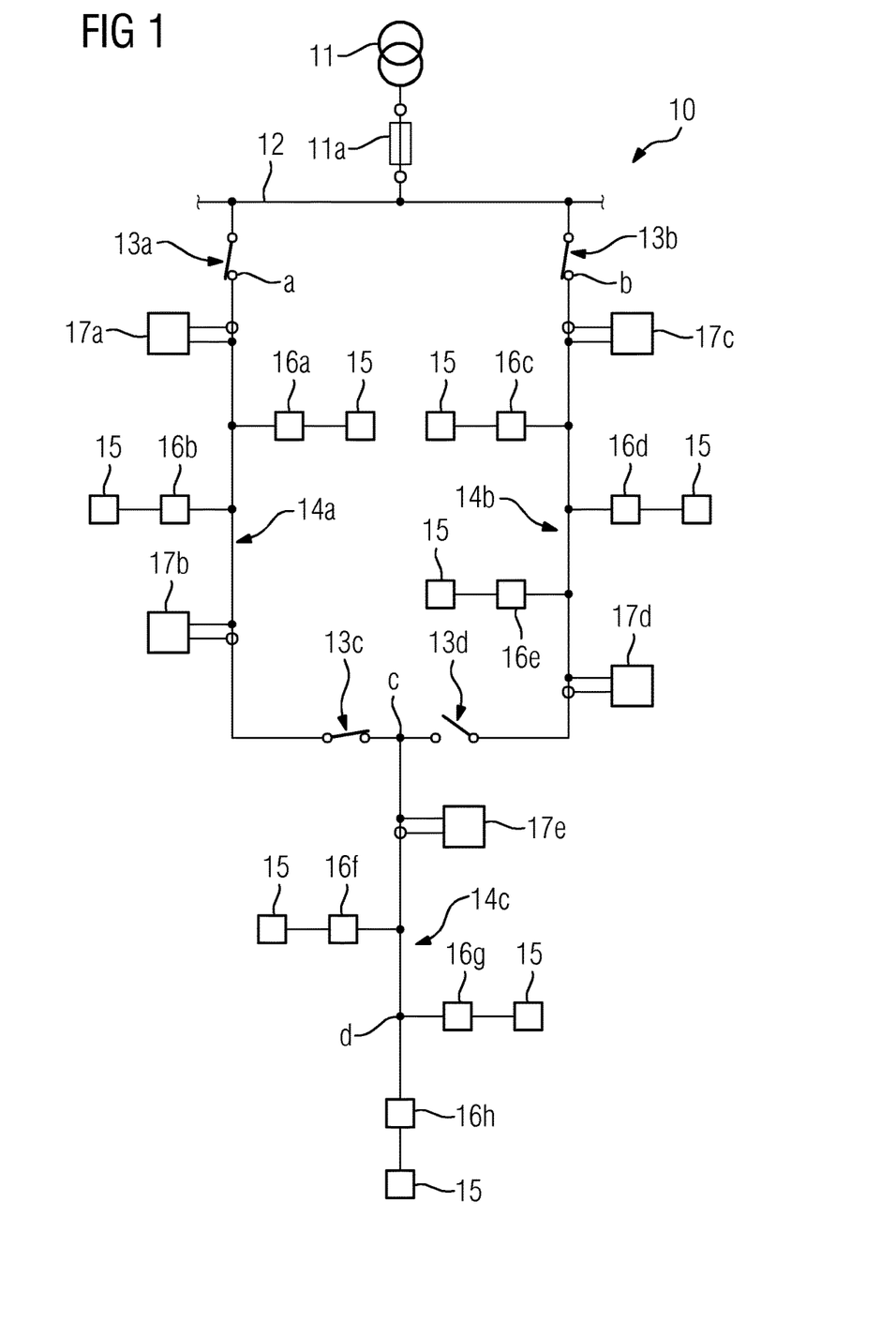
FIG. 1 an exemplary embodiment of a low-voltage distribution system according to the invention with reference to which the method according to the invention is also explained by way of example.

FIG. 1 shows an exemplary embodiment of a low-voltage distribution system according to the invention depicting a sub-area of a three-phase system. The low-voltage distribution system 10 comprises a power transformer 11 with a transformer fuse IIa, a busbar 12 with switch devices 13a and 13b (in closed position) and distribution system chains 14a (between points a and c), 14b (between the points b and c) and 14c (between the points c and d). The individual distribution system participants 15 (energy consuming devices or energy withdrawing devices) are connected to the system 10 by means of energy meters 16a to 16h. In the system topology shown in FIG. 1, the system chain 14c is connected to the chain 14a by means of a closed switching device 13c. The switching device 13d is open so that the chains 14c and 14b are electrically separated.

For monitoring the system chains 14a to 14c, current-measuring devices 17a to 17e are installed in the system and isolate the distribution system topology to three areas of the system. In addition, the energy meters 16a to 16h also comprise the components corresponding to the current-measuring devices 17a to 17e, which—as explained in more detail below—are used to monitor the system chains 14a to 14c. FIG. 1 shows the system chains 14a to 14c together with all the associated elements as a bundle of lines which is intended to symbolize the phase lines LI to L3 and the neutral conductor.

Figure 2:
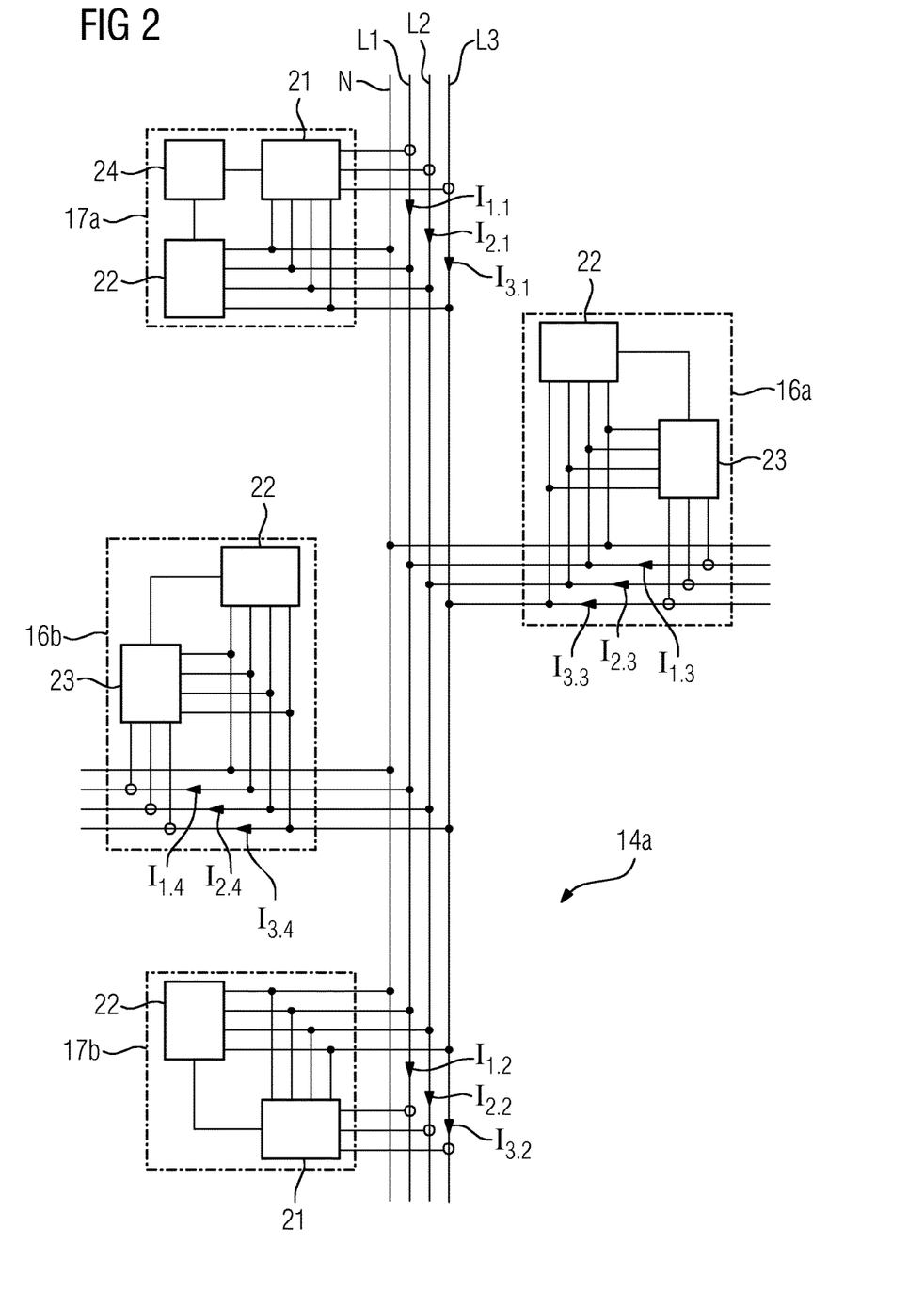
FIG. 2 a subsystem chain of the low-voltage distribution system according to FIG. 1 in more detail and FIG. 3 the low-voltage distribution system according to FIG. 1 after two switches have been changed over.

The distribution system area with the system chain 14a is shown in more detail in FIG. 2. The current-measuring devices 17a and 17b comprise an apparatus 21 for acquiring and processing currents and voltages and a communication apparatus 22, which is connected to phase conductors LI, L2 and L3 and/or the neutral conductor N and communicates via these. The energy meters 16a and 16b comprise an apparatus 23, which, in addition to the actual energy metering, also performs the acquisition and processing of currents and voltages of individual power lines. The energy meters 16a, 16b also comprise communication apparatuses 22. Both the energy meters 16a and 16b and the current-measuring device 17b communicate with the current-measuring device 17a, in particular with a central device 24 which is contained in the current-measuring device 17a and inter alia monitors the system chain 14a.

The monitoring of the currents in the distribution system chain 14a takes place in successive measuring cycles, which are initiated by the central device 24. At the start of a measuring cycle, the central device 24 sends a start telegram, which initiates a measurement and the duration thereof, to all apparatuses 21, 23, either directly, as in the current-measuring device 17a, or using a PLC method (PLC=power line communication) via the communication apparatuses 22. At the end of the measurement, average values of the amounts of the active currents in the phase conductors of the monitored distribution system branches ($I_{1.1}$, $I_{2.2}$, $I_{3.1}$, $I_{1.2}$, $I_{2.2}$, $I_{3.2}$, $I_{1.3}$, $I_{2.3}$, $I_{3.3}$, $I_{1.4}$, $I_{2.4}$ or $I_{3.4}$) are formed in the apparatuses 21, 23 of the energy meters 16a and 16b and in the current-measuring device 17a. After the measurement, these values are transmitted via the same communication links to the central device 24 in the current-measuring device 17a.

Figure 3:
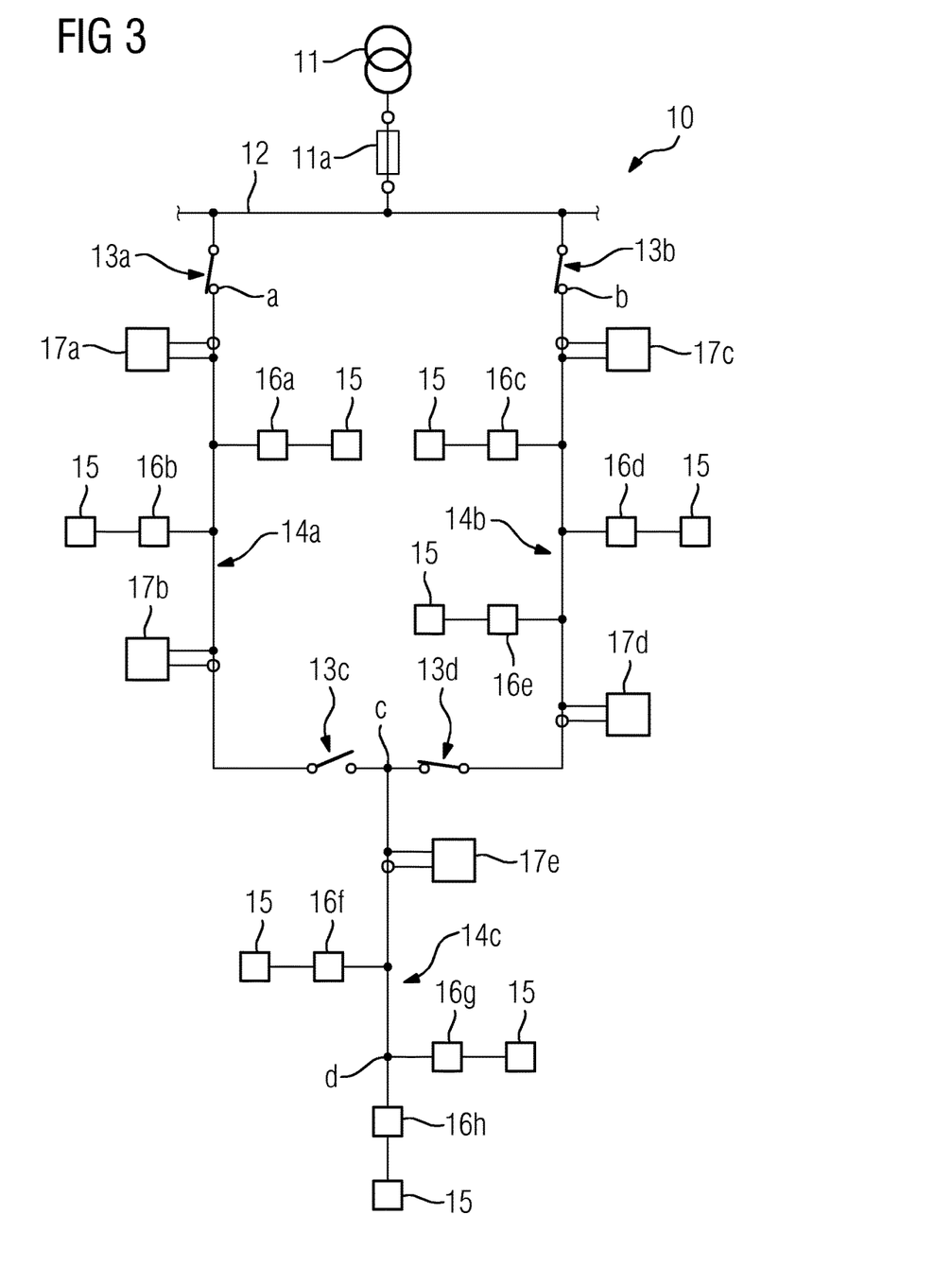

It is possible, for example, to use the transferred active current average values to estimate in the central device 24 whether the total of the currents $I_{2.1}$ and $I_{2.3}$ flowing in the phase conductor L2 exceed a certain planned value (threshold value) $I_{2.max}$. If the sum of the currents produces an excessive value and the current $I_{2.2}$ and $I_{2.4}$ flowing out of the chain is also not insignificantly low, the central device 24 could send an alarm message to the point responsible for the system operation in order to signal that the system section with the chain 14c should no longer be supplied via the chain 14a, but should preferably be supplied via the chain 14b. This can take place by opening the switching device 13c and closing the switching device 13d, as shown in FIG. 3.

It is also possible for a recognition to be performed in the central device 24 as to whether the area isolated by the participating current-measuring devices 17a, 17b and energy meters 16a, 16b is load-free and source-free, that is whether at no further point does active current flow into or out of the area. If namely the active current sum formed in each case from all active current values of a phase conductor, in terms of absolute value, does not exceed a threshold value—i.e. is close to the value zero—a load-free and source-free area which has been completely isolated by the current-measuring devices 17a and 17b and the energy meters 16a and 16b is recognized and the central device 24 generates a topology information item and sends it to a system control center, for example.

The monitoring of the system chains 14b and 14c by the current-measuring devices 17c and 17d and the energy meters 16c to 16e or by the current-measuring device 17e and the energy meters 16f to 16h is performed in the same way. It is, for example, possible to use the transferred active current average values to determine in the central device 24 the nature of the current switching status of the switching devices 13c and 13d and the current system configuration/topology. For example, it is possible to determine whether the system chain 14c is connected to the system chain 14a or to the system chain 14b or to both of them and how the current flow is divided between said system areas. Therefore, it is possible, for example, to obtain topology information items on the low-voltage electrical distribution system in that a group of at least two current-measuring devices arranged at different points in the low-voltage distribution system is selected, in each case the current is measured by the current-measuring devices so as to form a current measurement value, the current measurement values are added so as to form a current sum taking into consideration the current flow direction and a topology information item is formed, which specifies that the current-measuring devices electrically isolate a load-free and source-free section of the low-voltage distribution system when the current sum falls below a predetermined threshold value.

It is then possible to use topology information items such as areas recognized as load-free and source-free in a system control center to obtain a topology image. Similarly, it is also possible to recognize changes to the topology if it is suddenly no longer to form any topology information items for an area previously recognized as load-free and source-free.

To summarize, the low-voltage distribution system or the method for the operation of the same operation can have one or more of the following features:

To detect the parameters relevant for the distribution of electrical energy, in particular active and/or reactive currents taking into consideration the system voltages or the quality thereof, a system can be installed for at least one part of the distribution system that comprises at least one central device and at least one current-measuring device.

In at least one part of an AC current distribution system, the current-measuring devices can be installed at the points of the system which are particularly important for the monitoring of the topological properties of the AC current distribution system and/or of the part of the AC current distribution system, such as, for example, power line branches, power line bifurcations, power line nodes or power line isolating points and similar components and connected to at least one common power line (phase conductor or neutral conductor).

The distribution system topology isolation and monitoring can, for example, take place by means of:
  the detection of the switching statuses of the isolating points in at least one power line;
  the current-measuring devices;
  the formation and monitoring of active current balances in distribution system sub-areas/sections by the at least one central device due to the data, which was transmitted to the central device by the current-measuring devices; a distribution system sub-area/section to be monitored can be isolated by the current-measuring devices such that there are no loads or energy sources in the area; the system formed from the current-measuring devices can, for example, have the objective of detecting the associated active and/or reactive currents, which flow into and out of at least one of the lines of the distribution system, and other parameters relevant for the distribution of the electrical energy, in particular system voltages or the features thereof synchronously and transmitting the data acquired via a communication device, which can be a part of the current-measuring devices, to the at least one central device;
  a subsequent analysis (for example in the at least one central device) of the acquired and transferred switching statuses of the isolating points and/or the active current balances of the distribution system sub-areas/section, which can enable conclusions to be drawn regarding topological changes in the distribution system (interconnection/separation of the distribution system areas, switching on/switching off non-detected consumers/electricity generators in isolated distribution system areas and the like.

The monitoring of the electricity distribution, in particular of the active and/or reactive currents, taking into consideration the system voltages or the quality thereof in the distribution system can take place in the at least one central device on the basis of the data which was transmitted to the central device by the current-measuring devices. To this end, depending upon the isolation of the distribution system topology (see above points), the active and/or reactive currents flowing into or out of or through the monitored distribution system sections/areas can be evaluated with respect to their value and, if they exceed preset threshold values, transmitted to a further system (for example to a distribution system management system). Supplementarily or alternatively, in each case sums can be formed from the active and/or reactive currents, which flow into or out of the monitored distribution system section/area in order subsequently to create an active or reactive current flow balance for the distribution system section/area. These current flow balances can also be evaluated with respect to their value and, if preset threshold values are exceeded, transmitted to a further system (for example a distribution system management system). In addition, a comparison of the current balance of the important supply chains of the distribution system area/section with the current balance of the connected energy consumers and generators in the area enable a conclusion to be drawn as to how much of the current transport capacity is being used for the internal current generation and consumption within the distribution system area or how much of the current transport capacity remains available for forwarding the current to the other distribution system areas.

The monitoring of the voltage quality or the features of the network voltage, in particular the voltage fluctuations, dips, interruptions, flickers, harmonics etc., is performed in conjunction with the monitoring of the distribution system topology and/or the electricity distribution, in particular the active and/or reactive currents in the at least one central device and/or the further system (for example a distribution system management system). This has the objective of monitoring the power transport capability of the distribution system or the weak points thereof in that the voltage quality features, in particular with an elevated current load of the isolation distribution system areas/sections or individual power lines are analyzed and evaluated, in order, if applicable, to initiate measures to protect the distribution system (such as, for example, a temporary load reduction in the system or the removal of the too weakly dimensioned power lines).

Before or during the installation of the current-measuring devices or even during of the later operation of the current-measuring devices, preferably the following system-topology parameters are defined:
  the assignment of the system conductor connectors to the connectors of the current-measuring device;

the assignment of the system conductor connectors according to a common labeling of the phase conductors in the distribution system (uniform phase identification), if possible in situ;

the relation to the system topology of a positive/negative current flow direction; it can, for example, be specified that all active currents which flow into the isolated distribution system area are to be classed as negative or all those which flow out are to be classed as positive.

Alternatively, the relation to the system topology of a positive/negative current flow direction can only be defined or taken into consideration on the formation of a current sum balance.

A synchronous detection of the associated currents and other parameters relevant for the distribution of the electrical energy can be performed in the system continuously, once for a limited period or several times sporadically or by means of random checks as the circumstances require.

The control of the synchronous detection in the system is preferably performed either time-driven (for example at the start of the hour) or on a command from a master current monitoring device or one of the further apparatuses. In the case of time-controlled detection, the internal time references/clocks in the current-measuring devices are preferably synchronized in advance from a distance or by local setting.

The acquired values/parameters can be transmitted from the current-measuring devices to at least one of the current-measuring devices or to at least one separate central device via the communication links.

In order to reduce the amount of data to be transmitted, instead of selective sampling of the values/parameters, the integral values of the parameters (for example current-flow-direction-related active current average values within an acquisition period or the like) can be formed in the current-measuring devices and transmitted.

An assignment of the system conductor connectors according to a common labeling of the phase conductors in the distribution system can additionally or alternatively be determined automatically at a distance in the current-measuring devices themselves or in the central device or in the current-measuring devices in which the monitoring is performed.

If the phase-conductor-related assignment of the connectors of the current-measuring devices is not possible or difficult, the monitoring of the distribution system is preferably performed jointly for all or several phase conductors.

The installation of a plurality of current-measuring devices in a distribution system also enables the formation of a plurality of possibly overlapping, neighboring or independent balance groups. In this case, some current-measuring devices can belong to several current balance groups and/or several system isolating points. In this case, it is possible to place special emphasis on the current flow direction in a current monitoring device of this kind which can be assessed differently for neighboring balance groups.

The above-described at least one central device can also be a sub-function of a current-measuring device. A current-measuring device can also encompass the functions of several of the above-described current-measuring devices.

The above-described function of a current-measuring device and/or a further apparatus can also be implemented as a sub-function of an energy meter, a voltage-quality-measuring device, a data concentrator or an automation device.

The communication medium for the communication apparatuses or communication infrastructure can be the distribution system itself or a separate communication network.

To summarize: automatic monitoring of the topology of an electrical power distribution system, in particular the switching statuses thereof and changes to the topology of individual distribution system areas/sections, is made possible by the use of the current-measuring devices. These can be positioned in a distribution system such that exact knowledge of the system topology is not necessary and only a relatively rough structure of the system topology, such as, for example, power line chains between the important system nodes/isolating points and the switching status thereof, at least in the monitored area of the system, is known. System areas/sections of this kind can be monitored as a "whole" with respect to the currents flowing in and out and through and taking into consideration the voltage quality. Here, it is in particular advantageous that current-measuring devices are not required along a chain, only at the ends/isolating points thereof. The remaining currents from/to the individual energy consumers/suppliers can, for example, be acquired by so-called "smart-grid-energy meters" with the corresponding functions and transmitted to the central device.

A synchronous detection the currents and the subsequent analysis of the currents and the balances thereof enable the transport capacity of individual distribution system areas to be monitored in order to ensure a sufficient supply voltage quality and a reliable distribution system operation, in particular in the case of numerous distributed energy generators.

The use of the current-measuring devices also makes it possible to scale the size of the monitored distribution system areas virtually as desired or to monitor only certain local parts of the distribution system.

The method describe can also be implemented using an infrastructure already installed in a distribution system such as E-meters, voltage-quality-measuring devices or automation devices.

The invention claimed is:

1. A method of determining a topology information item on and controlling a low-voltage electrical distribution system, wherein low voltage is a voltage within a household, the method comprising:
   (a) selecting a group of at least two current-measuring devices arranged at mutually different points in the low-voltage distribution system;
   (b) measuring a current with each of the current-measuring devices so as to form respective current measurement values;
   (c) adding the current measurement values so as to form a current sum taking into consideration a current flow direction;
   (d) forming a topology information item, which specifies that the current-measuring devices electrically isolate a load-free and source-free section of the low-voltage distribution system when an absolute value of the current sum falls below a predetermined threshold value and using the topology information item formed to control the low-voltage distribution system.

2. The method according to claim 1, which comprises:
   (e) in the event that in step (d) no topology information item has been formed, selecting a new group of at least two current-measuring devices arranged at mutually different points in the low-voltage distribution system;
   (f) in each case measuring the current by the current-measuring devices of the new group so as to form new current measurement values;

(g) adding the new current measurement values so as to form a new current sum taking into consideration the current flow direction;

(h) forming a topology information item, which specifies that the current-measuring devices electrically isolate a load-free and source-free section of the low-voltage distribution system, when an absolute value of the new current sum falls below the predetermined threshold value; and (i) repeating steps (e) to (h) until a topology information item has been formed.

3. The method according to claim 2, which comprises:

before selecting the new group, connecting a further current-measuring device to the low-voltage electrical distribution system, wherein the further current-measuring device measures the current by an assigned switching device of the low-voltage distribution system; and adding the further current-measuring device to the new group of current-measuring devices.

4. The method according to claim 1, which comprises forming the current measurement values as time-averaged current measurement values of a fundamental component of the current flowing through the respective current-measuring devices.

5. The method according to claim 1, wherein the time-averaged current measurement values are time-averaged root-mean-square values, time-averaged amplitude values or time-averaged peak values of the fundamental component of the current.

6. The method according to claim 5, wherein in each case the time-averaged current measurement values indicate a time-averaged active current and/or reactive current of the fundamental component of the current flowing through the respective current-measuring device for a predetermined period.

* * * * *